US009008399B2

(12) United States Patent
Fain et al.

(10) Patent No.: US 9,008,399 B2
(45) Date of Patent: Apr. 14, 2015

(54) SYSTEM AND METHOD FOR JOINT RECONSTRUCTION OF SPATIAL AND SPECTRAL IMAGING DATA

(71) Applicant: Wisconsin Alumni Research Foundation, Madison, WI (US)

(72) Inventors: Sean B. Fain, Madison, WI (US); Kevin M. Johnson, Madison, WI (US); Jeremy W. Gordon, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 194 days.

(21) Appl. No.: 13/751,683

(22) Filed: Jan. 28, 2013

(65) Prior Publication Data
US 2014/0212012 A1 Jul. 31, 2014

(51) Int. Cl.
*G06T 11/00* (2006.01)
*G01R 33/48* (2006.01)
*A61B 5/055* (2006.01)
*G01R 33/56* (2006.01)
*G01R 33/485* (2006.01)
*G01R 33/561* (2006.01)

(52) U.S. Cl.
CPC ........... *G06T 11/003* (2013.01); *G01R 33/4824* (2013.01); *G01R 33/5601* (2013.01); *G01R 33/485* (2013.01); *G01R 33/561* (2013.01)

(58) Field of Classification Search
None
See application file for complete search history.

(56) References Cited

U.S. PATENT DOCUMENTS

| 4,999,580 | A | * | 3/1991 | Meyer et al. | 324/309 |
| 5,353,794 | A | * | 10/1994 | Miyazaki | 600/410 |
| 5,879,299 | A | * | 3/1999 | Posse et al. | 600/410 |
| 6,856,134 | B1 | | 2/2005 | Reeder et al. | |
| 2010/0013481 | A1 | * | 1/2010 | Hirata et al. | 324/309 |
| 2010/0329529 | A1 | * | 12/2010 | Feldman et al. | 382/131 |
| 2013/0129168 | A1 | * | 5/2013 | Ross | 382/128 |

OTHER PUBLICATIONS

Adalsteinsson, et al., Volumetric Spectroscopic Imaging with Spiral-Based k-Space Trajectories, Magnetic Resonance in Medicine, 1998, 39(6):889-898.
Ahn, et al., High-Speed Spiral-Scan Echo Planar NMR Imaging—I, IEEE Transactions on Medical Imaging, 1986, MI-5(1):2-7.
Ardenkjaer-Larsen, et al., Increase in Signal-To-Noise Ratio of >10,000 Times in Liquid-State NMR, PNAS, 2003, 100(18):10158-10163.
Ardenkjaer-Larsen, et al., Dynamic Nuclear Polarization Polarizer for Sterile Use Intent, NMR in Biomedicine, 2011, 24(8):927-932.
Brodsky, et al., Generalized k-Space Decomposition with Chemical Shift Correction for Non-Cartesian Water-Fat Imaging, Magnetic Resonance in Medicine, 2008, 59(5):1151-1164.

(Continued)

*Primary Examiner* — Jon Chang
(74) *Attorney, Agent, or Firm* — Quarles & Brady, LLP

(57) ABSTRACT

A system and method for simultaneously generating spectral images and spatial images of a subject using a magnetic resonance imaging (MRI) system includes acquiring MR image data using a k-space sampling trajectory. The k-space sampling trajectory is designed to spatially oversample to elicit phase differences between oversampled points. The MR image data is jointly reconstructed into spatial and spectral images by resolving spatial information from spatial encoding associated with each of the oversampled points and resolving spectral information from the phase differences between the oversampled points.

23 Claims, 9 Drawing Sheets

(56) References Cited

OTHER PUBLICATIONS

Chen, et al., Simultaneous Investigation of Cardiac Pyruvate Dehydrogenase Flux, Krebs Cycle Metabolism and pH, Using Hyperpolarized [1,2-13C2]pyruvate In Vivo, NMR in Biomedicine, 2012, 25(2):305-311.

Chen, et al., Fast Automatic Linear Off-Resonance Correction Method for Spiral Imaging, Magnetic Resonance in Medicine, 2006, 56:457-462.

Cunningham, et al., Double Spin-Echo Sequence for Rapid Spectroscopic Imaging of Hyperpolarized 13C, Journal of Magnetic Resonance, 2007, 187(2):357-362.

Day, et al., Detecting Tumor Response to Treatment Using Hyperpolarized 13C Magnetic Resonance Imaging and Spectroscopy, Nature Medicine, 2007, 13(11):1382-1387.

Duyn, et al., Simple Correction Method for k-Space Trajectory Deviations in MRI, Journal of Magnetic Resonance, 1998, 132:150-153.

Gallagher, et al., Magnetic Resonance Imaging of pH In Vivo Using Hyperpolarized 13C-Labelled Bicarbonate, Nature, 2008, 453:940-943.

Gillies, et al., Adaptive Landscapes and Emergent Phenotypes: Why Do Cancers Have High Glycolysis?, J. Bioenerg. Biomembr., 2007, 39:251-257.

Golman, et al., Metabolic Imaging by Hyperpolarized 13C Magnetic Resonance Imaging for In Vivo Tumor Diagnosis, Cancer Res., 2006, 66(22):10855-10860.

Gordon, et al., Direct Estimation of Hyperpolarized Metabolites with IDEAL Spiral CSI, Proc. Int. Soc. Mag. Reson. Med., 2012, 20:4299.

Hernando, et al., Robust Water/Fat Separation in the Presence of Large Field Inhomogeneities Using a Graph Cut Algorithm, Magnetic Resonance in Medicine, 2010, 63:79-90.

Hu, et al., Compressed Sensing for Resolution Enhancement of Hyperpolarized 13C Flyback 3D-MRSI, Journal of Magnetic Resonance, 2008, 192(2):258-264.

Janich, et al., Effects of Pyruvate Dose on In Vivo Metabolism and Quantification of Hyperpolarized 13C Spectra, NMR in Biomedicine, 2012, 25(1):142-151.

Josan, et al., Fast Volumetric Imaging of Ethanol Metabolism in Rat Liver with Hyperpolarized [1-13C]pyruvate, NMR in Biomedicine, 2012, 25(8):993-999.

Kohler, et al., In Vivo 13Carbon Metabolic Imaging at 3T with Hyperpolarized 13C-1-Pyruvate, Magnetic Resonance in Medicine, 2007, 58(1):65-69.

Kurhanewicz, et al., Analysis of Cancer Metabolism by Imaging Hyperpolarized Nuclei: Prospects for Translation to Clinical Research, Neoplasia, 2011, 13(2):81-97.

Larson, et al., Multiband Excitation Pulses for Hyperpolarized 13C Dynamic Chemical-Shift Imaging, Journal of Magnetic Resonance, 2008, 194(1):121-127.

Larson, et al., Investigation of Tumor Hyperpolarized [1-13C]-Pyruvate Dynamics Using Time-Resolved Multiband RF Excitation Echo-Planar MRSI, Magnetic Resonance in Medicine, 2010, 63(3):582-591.

Lustig, et al., A Fast Method for Designing Time-Optimal Gradient Waveforms for Arbitrary k-Space Trajectories, IEEE Trans. Med. Imaging, 2008, 27(6):866-873.

Mayer, et al., Fast Metabolic Imaging of Systems with Sparse Spectra: Application for Hyperpolarized 13C Imaging, Magnetic Resonance in Medicine, 2006, 56:932-937.

Mayer, et al., Application of Sub-Second Spiral Chemical Shift Imaging to Real-Time Multi-Slice Metabolic Imaging of the Rat In Vivo After Injection of Hyperpolarized 13C1-Pyruvate, Magnetic Resonance in Medicine, 2009, 62(3):557-564.

Mayer, et al., Dynamic and High-Resolution Metabolic Imaging of Hyperpolarized [1-13C]-Pyruvate in the Rat Brain Using a High-Performance Gradient Insert, Magnetic Resonance in Medicine, 2011, 65(5):1228-1233.

Peterson, et al., Simultaneous Proton and Hyperpolarized Carbon Imaging, Proc. Intl. Soc. Mag. Reson. Med., 2010, 18:1020.

Pineda, et al., Cramer-Rao Bounds for Three-Point Decomposition of Water and Fat, Magnetic Resonance in Medicine, 2005, 54(3):625-635.

Reeder, et al., Least-Squares Chemical Shift Separation for 13C Metabolic Imaging, Journal of Magnetic Resonance Imaging, 2007, 26(4):1145-1152.

Schulte, et al., Advanced Parallel Imaging Techniques for Metabolic Imaging with Hyperpolarised 13C, Proc. Intl. Soc. Mag. Reson. Med., 2011, 19:1522.

Wiesinger, et al., IDEAL Spiral CSI for Dynamic Metabolic MR Imaging of Hyperpolarized [1-13C]Pyruvate, Magnetic Resonance in Medicine, 2012, 68(1):8-16.

Witney, et al., Detecting Treatment Response in a Model of Human Breast Adenocarcinoma Using Hyperpolarised [1-13C]pyruvate and [1,4-13C2]fumarate, British Journal of Cancer, 2010, 103:1400-1406.

Xu, et al., Quantification of In Vivo Metabolic Kinetics of Hyperpolarized Pyruvate in Rat Kidneys Using Dynamic 13C MRSI, NMR in Biomedicine, 2011, 24(8):997-1005.

Yen, et al., Imaging Considerations for In Vivo 13C Metabolic Mapping Using Hyperpolarized 13C-Pyruvate, Magnetic Resonance in Medicine, 2009, 62(1):1-10.

Zhao, et al., Gradient-Echo Imaging Considerations for Hyperpolarized 129Xe MR, Journal of Magnetic Resonance, Series B, 1996, 113:179-183.

\* cited by examiner

SYSTEM AND METHOD FOR JOINT RECONSTRUCTION OF SPATIAL AND SPECTRAL IMAGING DATA

STATEMENT REGARDING FEDERALLY SPONSORED RESEARCH

This invention was made with government support under AG033514 awarded by the National Institutes of Health. The government has certain rights in the invention.

CROSS-REFERENCE TO RELATED APPLICATIONS

N/A

BACKGROUND OF THE INVENTION

The field of the invention is systems and methods for magnetic resonance imaging ("MRI"). More particularly, the invention relates to systems and methods for reconstructing spatial and spectral imaging data, for example, when employing hyperpolarized imaging techniques.

When a substance such as human tissue is subjected to a uniform magnetic field (polarizing field B0), the individual magnetic moments of the excited nuclei in the tissue attempt to align with this polarizing field, but process about it in random order at their characteristic Larmor frequency. If the substance, or tissue, is subjected to a magnetic field (excitation field B1) which is in the x-y plane and which is near the Larmor frequency, the net aligned moment, Mz, may be rotated, or "tipped", into the x-y plane to produce a net transverse magnetic moment Mt. A signal is emitted by the excited nuclei or "spins", after the excitation signal B1 is terminated, and this signal may be received and processed to form an image.

When utilizing these "MR" signals to produce images, magnetic field gradients (Gx, Gy, and Gz) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

Magnetic resonance spectroscopy ("MRS") may be used in vivo for the determination of individual chemical compounds located within a volume of interest. The underlying principle of MRS is that atomic nuclei are surrounded by a cloud of electrons that slightly shield the nucleus from any external magnetic field. As the structure of the electron cloud is specific to an individual molecule or compound, the magnitude of this screening effect is then also a characteristic of the chemical environment of individual nuclei. Since the resonant frequency of the nuclei is proportional to the magnetic field it experiences, the resonant frequency can be determined not only by the external applied field, but also by the small field shift generated by the electron cloud. Detection of this chemical shift, which is usually expressed as "parts per million" ("ppm") of the main frequency, requires high levels of homogeneity of the main magnetic field, $B_0$.

Typically, MR proton spectroscopy is used to generate a one-dimensional (1D) frequency spectrum representing the presence of certain chemical bonds in the region of interest. In medical diagnosis and treatment, MRS provides a non-invasive means of identifying and quantifying metabolites from a region of interest, often the human brain. By finding the relative spectral amplitudes resulting from frequency components of different molecules, medical professionals can identify chemical species and metabolites indicative of diseases, disorders, and other pathologies such as Alzheimer's disease, cancer, stroke, and the like. In this context, two nuclei are typically of particular interest, hydrogen-1 and phosphorous-31. Phosphorus 31 MRS is directed to the detection of compounds involved in energy metabolism relating to membrane synthesis and degradation. Metabolites of particular interest in proton MRS studies include glutamate (Glu), glutainine (Gln), choline (Cho), creatine (Cre), N-acetylasparate (NAA), and the inositols (ml and sl).

With newer contrast agents such as hyperpolarized $^{13}C$, metabolic processes can be observed in the human body, such as in the context of cancer detection, by analyzing the signal contributions from various metabolites in regions of interest. MR imaging of $^{13}C$ holds the potential to probe pathology at a molecular level. Unfortunately, signal from endogenous $^{13}C$ is substantially indistinguishable from noise due to low receptivity, sub millimolar in-vivo concentrations, and scan-time limitations.

Recent advances in hyperpolarization now allow for 10,000 fold increases in polarization, enabling the use of $^{13}C$ labeled molecules as tracers. With modern dynamic nuclear polarization (DNP), many important endogenous, organic molecules can be polarized and subsequently imaged. For example, hyperpolarized (HP) [$1$-$^{13}C$]pyruvate shows potential as a molecular biomarker of cellular metabolism. In experiments, a small sample of [$1$-$^{13}C$]pyruvate has been hyperpolarized and intravenously injected. In-vivo, it is transported into the cell and undergoes rapid conversion into its primary metabolic byproducts, [$1$-$^{13}C$]lactate, [$1$-$^{13}C$]alanine, and $^{13}C$ bicarbonate.

Imaging of HP $^{13}C$ compounds is more challenging than many other contrast agents because the transient increase in polarization decays at a rate governed by the nuclear spin-lattice relaxation time, $T_1$. Also, once injected and subsequently imaged in-vivo additional decay is observed due to radio frequency (RF) excitation, and chemical and spin exchange with the endogenous environment. As such, with each passing second following removal from the polarizer, the HP $^{13}C$ compounds become less effective contrast agents.

Furthermore, spectral imaging with hyperpolarized species presents substantially different challenges than with endogenous, thermally polarized nuclei. While the signal-to-noise ratio (SNR) is quite high for a single RF excitation, each excitation consumes a portion of the finite hyperpolarization. Due to perfusion and washout, $^{13}C$ molecules are imaged while undergoing multiple dynamic processes. Thus, dynamic imaging is essential for potential quantification of apparent conversion rates. Conventional spectroscopic imaging techniques, such as chemical shift imaging (CSI), provide excellent spectral resolution, but the long imaging time (~10 s) and the need to phase encode both spatial dimensions limits the ability to measure dynamics. Rapid spectroscopic imaging techniques, such as echo planar spectroscopic imaging (EPSI) and spiral CSI, greatly reduce the scan time and RF deposition but are often limited by a narrow spectral bandwidth, a consequence of gradient slew-rate limitations and the reduced $^{13}C$ gyromagnetic ratio (~4× lower than $^1H$).

SUMMARY OF THE INVENTION

The present invention overcomes the aforementioned drawbacks by providing a system and method for generating spectral images and spatial images of a subject using a magnetic resonance imaging (MRI) system.

In accordance with one aspect of the present disclosure, a method for simultaneously generating spectral images and spatial images of a subject using a magnetic resonance imaging (MRI) system is disclosed. The method includes arranging a subject having received a dose of a hyperpolarized molecular imaging compound within an MRI system. The method also includes acquiring MR image data from the subject according to a k-space sampling trajectory that spatially oversamples to encode both spatial frequency information and spectral frequency information in the oversampled points. The method further includes reconstructing the MR image data into spatial and spectral images using a priori knowledge of an expected chemical species associated with the molecular imaging compound and a model-based reconstruction technique.

In accordance with another aspect of the present disclosure, a magnetic resonance imaging (MRI) system is disclosed that includes a magnet system configured to generate a magnetic field about at least a region of interest (ROI) in a subject arranged in the MRI system and a plurality of gradient coils configured to apply a gradient field with respect to the magnetic field. The MRI system also includes a radio frequency (RF) system configured to apply an excitation field to the subject and acquire MR image data from a ROI and a computer system. The computer system is programmed to control the plurality of gradient coils and the RF system to acquire MR image data according to a k-space sampling trajectory designed to spatially oversample to elicit phase differences between oversampled points. The computer system is further programmed to jointly reconstruct the MR image data into spatial and spectral images by resolving spatial information from spatial encoding associated with each of the oversampled points and resolving spectral information from the phase differences between the oversampled points.

In accordance with yet another aspect of the present disclosure, a method for generating spectral images and spatial images of a subject using a magnetic resonance imaging (MRI) system is disclosed. The method includes arranging a subject having received a dose of a hyperpolarized molecular imaging compound within an MRI system. The method also includes acquiring MR image data using a k-space sampling trajectory designed to spatially oversample to elicit phase differences between oversampled points. The method further includes jointly reconstructing the MR image data into spatial and spectral images by resolving spatial information from spatial encoding associated with each of the oversampled points and resolving spectral information from the phase differences between the oversampled points.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

The present disclosure provides a system and method to generate spatially and spectrally resolved images with a magnetic resonance imaging (MRI) system to provide the ability to probe pathology at a molecular level within the limitations of clinical medicine and provide results in a manner that is clinically useful.

Specifically, the present invention recognizes that chemical species with unique resonant frequencies can be produced and tracked, especially with injection of metabolically active molecules. With a priori knowledge of the expected chemical species, the present disclosure provides a model-based spectral reconstruction technique for spatially and spectrally investigating a subject. As will be described, model-based reconstruction techniques, such as least squares estimation algorithms and compressed sensing approaches can be utilized. Unlike conventional Fourier based spectroscopic imaging, optimally chosen echo-times can be used to control spectral aliasing without the need to fully sample the spectral dimension. Combined with efficient k-space sampling strategies, such as centric phase encoding, variable flip-angle schemes, spiral sampling, and the like, these techniques can further reduce RF decay while still providing high spectral resolution and SNR data.

Thus, as will be described, a single RF excitation may be used by oversampling spatial k-space. A reconstruction technique is provided that jointly solves for both spatial frequency and spectral frequency dimensions, that is so-called k-t sampling, utilizing a model based approach. Using the phase evolution over the k-t trajectory allows reconstruction from a single or multiple spiral shots based on the desired image quality and scan efficiency.

The present disclosure recognizes that preferential conversion of pyruvate to lactate is an indicator of increased glycolysis, a common feature of cancerous lesions associated with the Warburg Effect. That is, the Warburg Effect refers to the recognition that many cancer cells predominantly produce energy by a high rate of glycolysis followed by lactic acid fermentation in the cytosol. This stands in contrast to most normal cells that reflect a comparatively low rate of glycolysis followed by oxidation of pyruvate in mitochondria. The present disclosure recognizes that the quantification of pyruvate metabolism presents the potential to improve evaluation of cancer, including, for example, prostate cancer and glioblastomas, by exploiting the Warburg Effect. To this end, the present disclosure provides a system and method to use MRI techniques to quantify pyruvate metabolism to dramatically improve evaluation of prostate cancer and glioblastomas, for example, where fluorodeoxyglucose positron emission tomography (FDG-PET) shows limited prognostic value. Other promising, but not inclusive, hyperpolarized compounds are $^{13}$C bicarbonate to measure extracellular pH and [1,4-$^{13}$C$_2$]fumarate to measure cellular necrosis.

Figure 1:
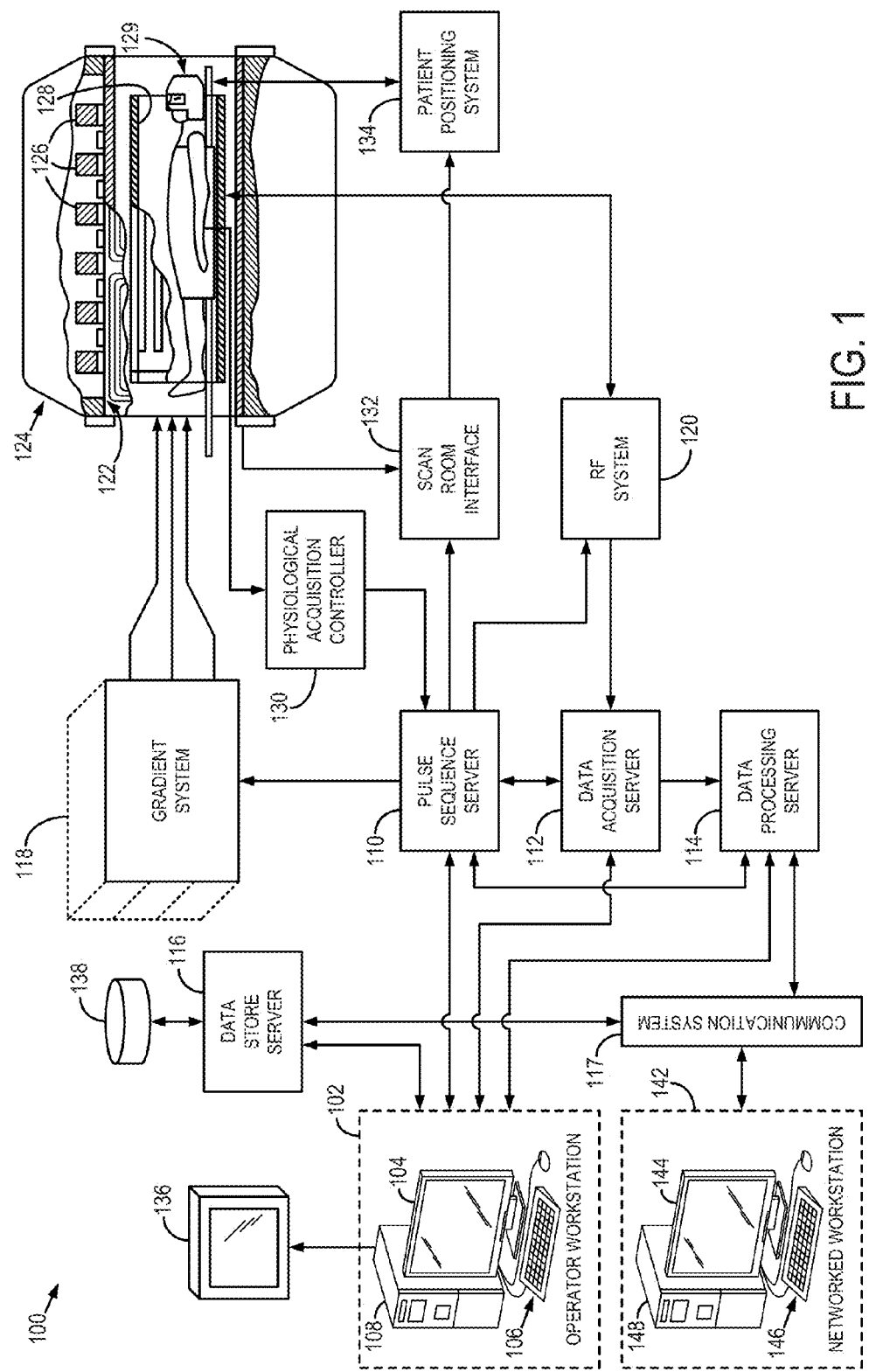
FIG. 1 is a block diagram of an example magnetic resonance imaging system configured for use with the present disclosure.

Referring particularly now to FIG. 1, an example of a MRI system 100 is illustrated. The MRI system 100 includes an operator workstation 102, which will typically include a display 104, one or more input devices 106, such as a keyboard and mouse, and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to four servers: a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 117, which may include any suitable network connection, whether wired, wireless, or a combination of both. As an example, the communication system 117 may include both proprietary or dedicated networks, as well as open networks, such as the internet.

The pulse sequence server 110 functions in response to instructions downloaded from the operator workstation 102 to operate a gradient system 118 and an RF system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding magnetic resonance signals. The gradient coil assembly 122 forms part of a magnet assembly 124 that includes a polarizing magnet 126 and a whole-body RF coil 128 and/or local coil, such as a head coil 129.

RF waveforms are applied by the RF system 120 to the RF coil 128, or a separate local coil, such as the head coil 129, in order to perform the prescribed magnetic resonance pulse sequence. Responsive magnetic resonance signals detected by the RF coil 128, or a separate local coil, such as the head coil 129, are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays, such as the head coil 129.

The RF system 120 also includes one or more RF receiver channels. Each RF receiver channel includes an RF preamplifier that amplifies the magnetic resonance signal received by the coil 128/129 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \quad (1);$$

and the phase of the received magnetic resonance signal may also be determined according to the following relationship:

$$\varphi = \tan^{-1}\left(\frac{Q}{I}\right). \quad (2)$$

The pulse sequence server 110 also optionally receives patient data from a physiological acquisition controller 130. By way of example, the physiological acquisition controller 130 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data is lost by data overrun. In some scans, the data acquisition server 112 does little more than pass the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data is acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also be employed to process magnetic resonance signals used to detect the arrival of a contrast agent in a magnetic resonance angiography (MRA) scan. By way of example, the data acquisition server 112 acquires magnetic resonance data and processes it in real-time to produce information that is used to control the scan.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction algorithms, such as iterative or back-projection reconstruction algorithms; applying filters to raw k-space data or to reconstructed images; generating functional magnetic resonance images; calculating motion or flow images; and so on.

Images reconstructed by the data processing server 114 are conveyed back to the operator workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144; one or more input devices 146, such as a keyboard and mouse; and a processor 148. The networked workstation 142 may be located within the same facility as the operator workstation 102, or in a different facility, such as a different healthcare institution or clinic.

The networked workstation 142, whether within the same facility or in a different facility as the operator workstation 102, may gain remote access to the data processing server 114 or data store server 116 via the communication system 117. Accordingly, multiple networked workstations 142 may have access to the data processing server 114 and the data store server 116. In this manner, magnetic resonance data, reconstructed images, or other data may exchanged between the data processing server 114 or the data store server 116 and the networked workstations 142, such that the data or images may be remotely processed by a networked workstation 142. This data may be exchanged in any suitable format, such as in accordance with the transmission control protocol (TCP), the internet protocol (IP), or other known or suitable protocols.

Figure 2:
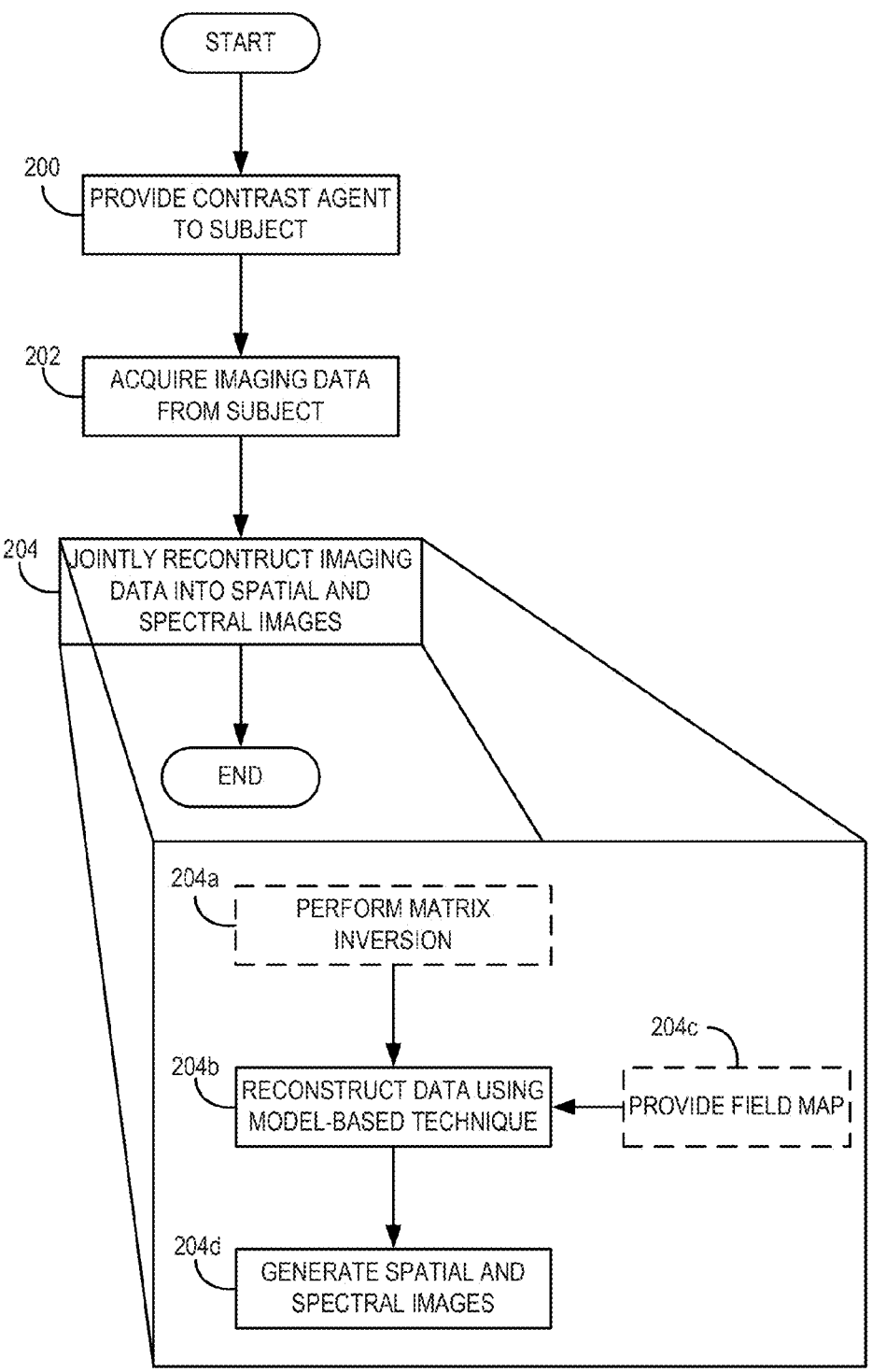
FIG. 2 is a flow chart setting forth exemplary steps of an imaging technique in accordance with the present disclosure.

Referring to FIG. 2, the method of imaging a subject using the above-described MRI system begins at process block 200 by providing the subject being imaged with a dose of a contrast agent, such as a hyperpolarized $^{13}C$ compound. Thereafter, at process block 202, imaging data is acquired from the subject. The MR signals acquired with an MRI system, such as described above with respect to FIG. 1, are signal samples of the subject of the examination in Fourier space, or what is often referred to in the art as "k-space." In this regard, the acquired data is often referred to as k-space data. Each MR measurement cycle, or pulse sequence, typically samples a portion of k-space along a sampling trajectory characteristic of that pulse sequence.

In traditional approaches to chemical shift imaging (CSI), several images are collected with the same k-space trajectory but at different echo times (TE). For example, iterative decomposition of water and fat with echo asymmetry and least squares estimation ("IDEAL") is a multi-echo chemical species separation technique that has been shown to effectively separate water and fat with a number of different acquisitions. As described, for example, in U.S. Pat. No. 6,856,134, which is incorporated herein by reference in its entirety, the IDEAL method may employ a pulse sequence that acquires image data by sampling echo signals that occur at TE times in a single repetition time ("TR") period. An iterative, linear least squares approach, is used to estimate the separate water and fat signal components in images reconstructed from the acquired image data. The IDEAL algorithm can use a field map to consider $B_0$ field inhomogeneities before decomposing the signal into, for example water and fat channels.

Unfortunately, as explained above, with each passing second following removal from the polarizer and for each RF excitation, hyperpolarized contrast agents, such as those including HP $^{13}C$ compounds become less effective. Rapid spectroscopic imaging techniques, such as echo planar spectroscopic imaging (EPSI) and spiral CSI, greatly reduce the scan time and RF deposition but are often limited by a narrow spectral bandwidth, a consequence of gradient slew-rate limitations and the reduced $^{13}C$ gyromagnetic ratio (~4× lower than $^{1}H$). However, the sparse [1-$^{13}C$]pyruvate spectrum is well-suited to these techniques, as off-resonance peaks can be aliased without spectral overlap and corrected in the reconstruction.

Traditional approaches to spiral CSI require repeated spectral interleaves, resulting in a single point in spatial k-space that is acquired at multiple echo times. However, in accordance with the present disclosure, instead of using the traditional techniques described above that require multiple RF excitations to acquire spectrally resolved data, a k-t space approach may be used to increase data acquisition efficiency by reducing the number of echoes required to generate spectroscopic images. This k-t space approach, which may be a single-shot approach, thereby allows accelerated acquisition speed, preserved polarization, and/or improved temporal or spatial resolution over traditional methods.

In particular, ignoring the field map term and phase array coil sensitivities for simplicity, the signal at each TE can then be expressed in k-space as:

$$\tilde{S}(\vec{k}, TE) = \sum_{i=1}^{N} \tilde{\rho}_i(\vec{k}) e^{j2\pi \Delta f_i \cdot (\tau(\vec{k}) + TE)}; \qquad (3)$$

where $\tilde{S}(\vec{k},TE)$ is the spatial Fourier transform of the signal, $\tilde{\rho}_i$ is the spatial Fourier transform of the $i^{th}$ chemical species signal distribution with chemical shift $\Delta f_i$, and $\tau(\vec{k})$ is the relative time between k-space acquisition and the echo time. Currently utilized methods for IDEAL require repeated k-space trajectories at several TEs in-order to allow for estimation of chemical species. As will be described, jointly solving for both spatial and spectral encoding removes this constraint. Subsequently, there is substantial freedom in the design of k-t sampling strategies and a vast array of sampling patterns which provide a sufficiently conditioned encoding matrix, including traditional approaches. Within this context, it is possible to select a k-space sampling trajectory that will acquire the desired information needed to spectrally resolve and spatially resolve images without the need for repeated excitations or excessive TEs, both of which detrimentally reduce the effectiveness of hyperpolarized $^{13}C$ and other spectrally resolved hyperpolarized compounds (for example, $^{129}Xe$ gas and dissolved phases after inhalation in the lungs) as contrast agents.

Conventionally to obtain a fully sampled k-space dataset, at least N echo times are desired to generate N metabolite images. However, instead of needing to acquire separate echoes to acquire the necessary information to provide the desired spectral resolution, the present disclosure recognizes that phase differences elicited by particular sampling trajectories can be used to spectrally resolve the acquired data. For example, using a forward spiral k-space sampling trajectory, $\tau(\vec{k})$ is zero at the start of acquisition and increases throughout the readout. In order to maximize SNR efficiency for $^{13}C$ applications, a long duration readout may be used to take advantage of the extended (20-60 ms) $T_2^*$ of hyperpolarized $^{13}C$ species.

The acquisition of k-space data can follow any of a wide variety of trajectories through k-space and may be embodied as two-dimensional (2D) or three-dimensional (3D) acquisition schemes. Considerations when designing a trajectory include overall efficiency, sampling coverage, and resolution. As will be described, one such sampling trajectory is a spiral trajectory or spiral trajectory that may be modified. The sequence may be 2D or 3D. Such 3D sampling schemes may include a stack of spirals, a stack of cones, or the like. Also, a 2D multi-slice acquisition may be leveraged to acquire a 3D data set.

Figure 3A:
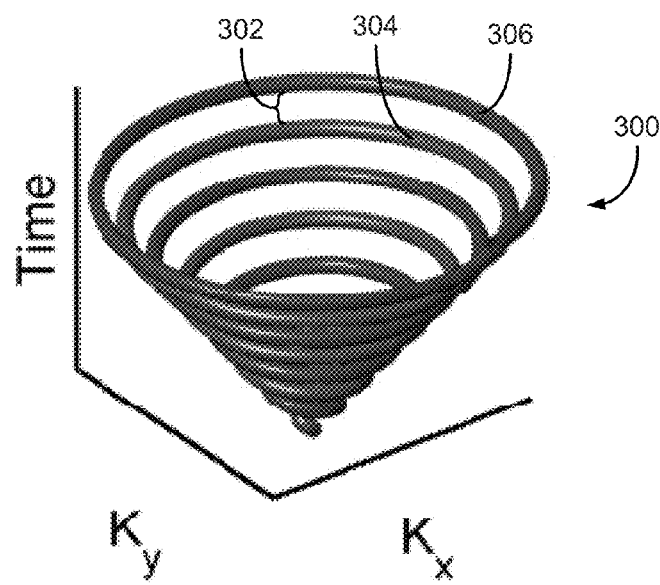
FIGS. 3a-3c are k-space diagrams illustrating k-space sampling strategies in accordance with the present disclosure.
Figure 3B:
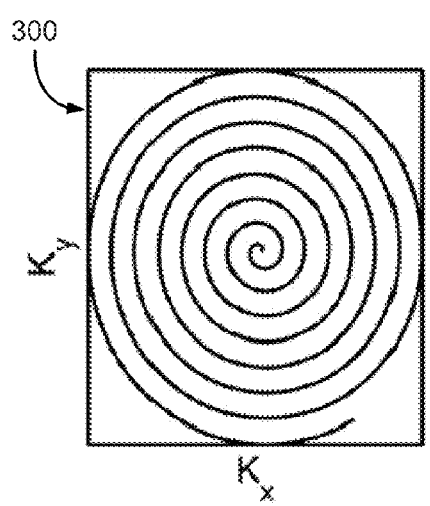
Figure 3C:
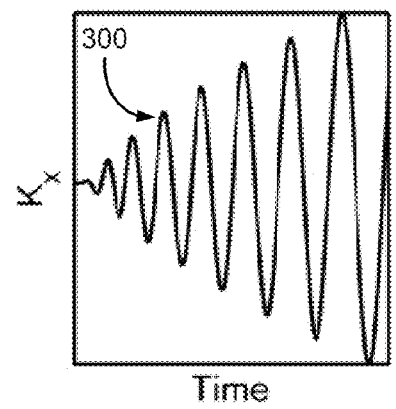

One example is a spiral trajectory. For example, a highly efficient, modified spiral trajectory 300 is illustrated in FIGS. 3a-3c and may be advantageously utilized. As illustrated, the modified spiral trajectory 300 is designed with a $\Delta k$ between adjacent spiral rotations 302 that is η times smaller than required for the nominal field of view (FOV). In this way, spatial k-space is effectively oversampled by a factor of η or greater if spatial sensitivity from phase-array coils is considered. Viewed in k-t space, time is effectively sampled η times greater than a spiral designed for this nominal FOV. As a result, there is an effective Δt between adjacent spiral rotations 302 that can be utilized for species separation.

Figure 4A:
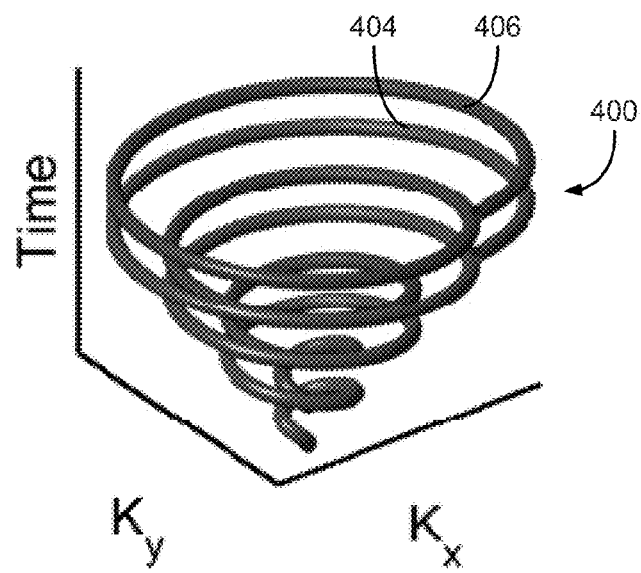
FIGS. 4a-4c are k-space diagrams illustrating k-space sampling using traditional strategies.
Figure 4B:
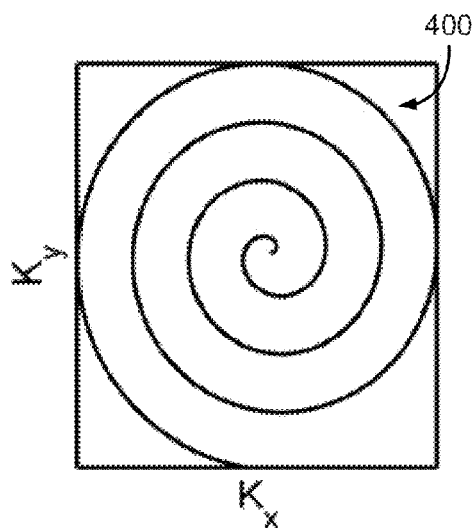
Figure 4C:
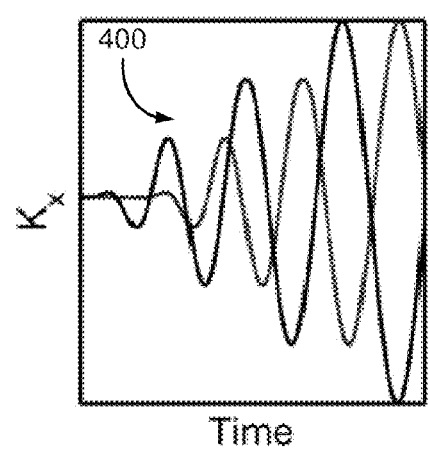

This point can be best demonstrated by a comparison of the modified spiral trajectory 300 of FIGS. 3a-3c with η=2 against a conventional two-shot spiral trajectory 400 of FIGS. 4a-4c. For the oversampled modified spiral trajectory 300 of FIG. 3, if rotations are split into an odd 304 and even rotations 306, spatial k-space will be fully sampled. This is functionally similar to the traditional acquisition of k-space in the spiral sampling 400 trajectory of FIG. 4 in two shots, in which fully sampled k-space is explicitly acquired in a first shot 404 and then a successive shot 406. However, as described above, using two shots detrimentally reduces the effectiveness of hyperpolarized $^{13}$C compounds and other hyperpolarized contrast agents.

For conventional slice-selective excitation, the slice-thickness can be calculated as:

$$T_{sl} = \frac{BW}{\gamma G_{sl}}; \quad (4)$$

where $T_{sl}$ is the slice-thickness, BW is the bandwidth of the RF excitation, and $G_{sl}$ is the strength of the slice-select gradient. If the slice-selection parameters are equal, the carbon slice will therefore have four times the thickness ($\gamma(^{13}C)=\frac{1}{4}\gamma(^{1}H)$) of the proton slice. In order to achieve the same thickness, the carbon RF excitation must have a bandwidth that is four times narrower. This can be achieved by either lengthening the RF pulse or by changing the pulse shape. The RF pulse can be identical on both channels, resulting in a slice thickness for $^{13}$C that is 4 times that of $^{1}$H in order to benefit from the additional SNR that the thicker slice affords.

Figure 9:
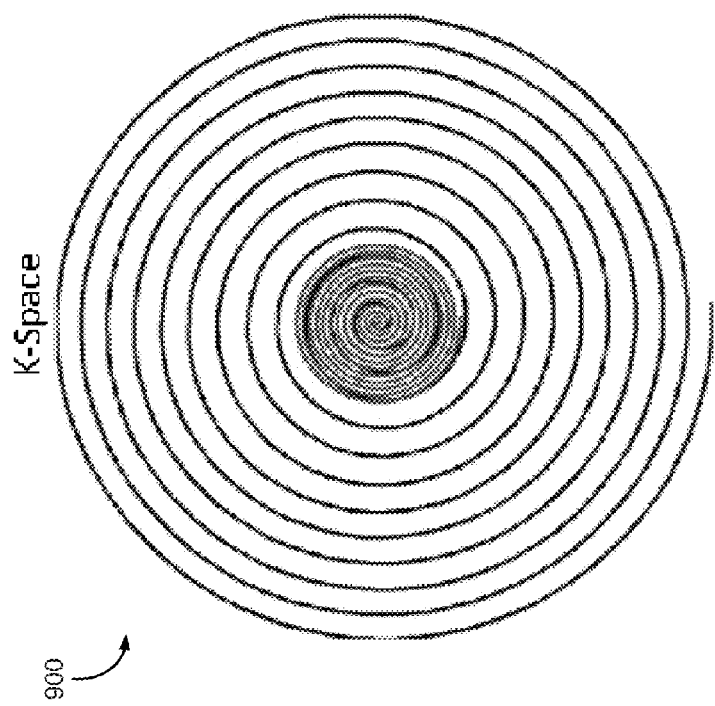
FIG. 9 illustrates one embodiment of a joint spiral trajectory for spectroscopic imaging of hydrogen-1 in fat and water simultaneously with $^{13}C$ MRI.

The in-plane resolution and field-of-view (FOV) is also modulated by the difference in gyromagnetic ratios. The factor of γ affects the spatial frequency, which is calculated as:

$k_r = \gamma \int G_r(t) dt$ $FOV = 1/\Delta k$ $\Delta_r = \frac{1}{2} k_{max}$ (5);

where $k_r$ is the time-dependent k-space position, $G_r$ is the spatial encoding gradient, FOV is the field of view, and $\Delta_r$ is the in-plane resolution. The dependence on the gyromagnetic ratio modulates the k-space trajectory, resulting in a spiral sampling pattern for $^{13}$C that extends to only $\gamma^{13}C/\gamma^{1}H=\frac{1}{4}$ of $k_{max}$ of the $^{1}$H nucleus. Thus, referring to FIG. 9, an exemplary k-space trajectory 900 is illustrated that is modulated by the γ of each nucleus, effecting both the resolution and FOV of the $^{13}$C data.

Figure 10:
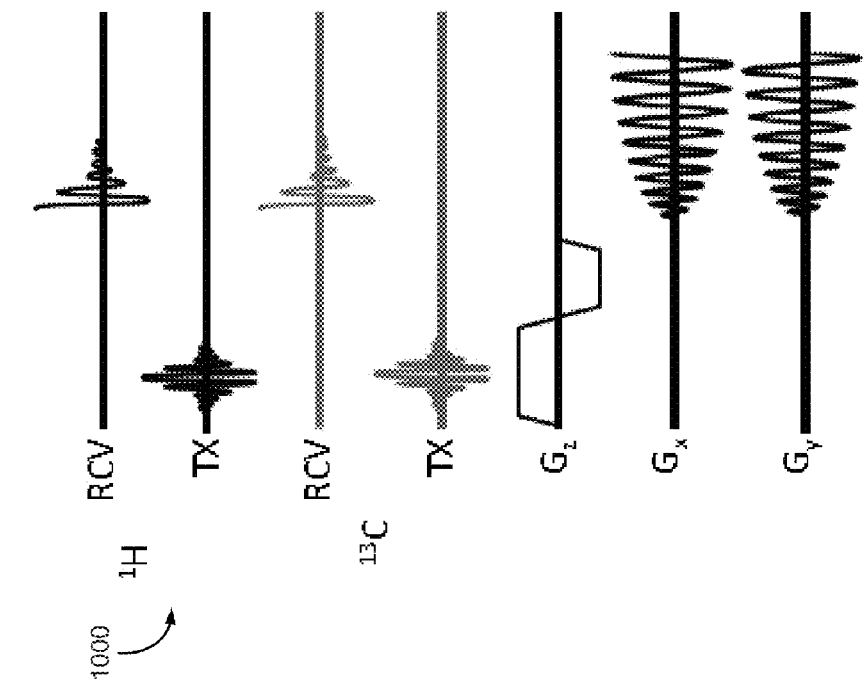
FIG. 10 illustrates an example of a pulse sequence for use with the present disclosure.

Referring to FIG. 10, an exemplary pulse sequence 1000 for use with the present disclosure is provided to simultaneously acquire the aforementioned data. The pulse sequence 1000 illustrates the design and playout for a simultaneous single-shot spiral acquisition of $^{1}$H and $^{13}$C. Because the same gradient and sampling bandwidth is used, the resulting effect is carbon encoding that is 4 times denser, leading to a 4 times larger FOV with 4 times lower resolution relative to $^{1}$H sampling. This is advantageous in practice, as even with hyperpolarization, the carbon signal supports only relatively large voxels compared to the proton signal given the relatively low concentration of the $^{13}$C label in the tissues. This difference in FOV and resolution may be accounted for by appropriate scaling of the k-space trajectory, along with sin c-interpolation using zero-padding.

FIGS. 3a-3c illustrate data acquisition using an Archimedean spiral trajectory. This results in short intra-spiral temporal spacing at the center of spatial k-space and longer spacing at the edge. In certain situations, there is not sufficient phase accrual during the center of k-space intervals, which may result in poor noise performance. Alternative spiral design strategies may be used. For example, a constant angular velocity spiral will, by definition, have uniform temporal spacing between adjacent spiral rotations. Trajectories could therefore use optimal separation between adjacent spiral rotations based on NSA analysis and, if properly designed, provide increased noise performance in certain situations. Alternatively, variable density sampling can be utilized to provide a higher η at the center of k-space than the edge. Additionally, parallel imaging, which naturally increases the effective FOV, and compressed sensing may be used further improve noise performance. Both parallel imaging and compressed sensing are highly compatible with the reconstruction that will be described.

Referring again to FIG. 2, at process block 204, the acquired data is reconstructed into spatial and spectral images. As illustrated, process block 204 can be further described as a series of sub-steps. Specifically, using equation 3, at process block 204a, data can, optionally, be reconstructed by performing matrix inversion, such as utilized in the above-referenced IDEAL techniques, or an inverse discrete Fourier transform, such as used often with spiral CSI, at each k-space location to separate chemically shifted species. For example, with a Fourier transform:

$$\tilde{\rho}_i(\vec{k}) = \sum_{j=1}^{M} S(\vec{k}, TE_j) e^{-i2\pi\Delta f_i \cdot (\tau(\vec{k}) + TE_j)}; \quad (6)$$

where M is the number of collected echo times.

Regardless of whether a matrix-inversion/reconstruction is performed or desired, at process block 204b, $\rho_i(\vec{r})$, the signal distribution of the $i^{th}$ chemical species, can be reconstructed by using a model-based reconstruction technique that separates spectral and k-space reconstruction and are sensitive to errors from field map variations.

Specifically, the signal from N expected chemical species from a hyperpolarized MRI experiment can be modeled:

$$S(t) = \int_{Volume} e^{i\vec{k}(t) \cdot \vec{r} + \psi(\vec{r}) \cdot t} \sum_{i=1}^{N} \rho_i e^{i2\pi\Delta f_i \cdot t}; \quad (7)$$

where S(t) is the acquired signal, $\vec{r}$ is the spatial vector encoding position in the object, $\psi(\vec{r})$ is the $B_0$ field map, $\vec{k}(t)$ is the k-space position, and $\Delta f_i$ and $\rho_i$ are the chemical shift and spatial signal distribution of the $i^{th}$ species, respectively. In principle, solving for $\rho_i$ directly from equation 7 will produce a more accurate reconstruction than separate spatial and spectral reconstructions. Solving for ρ is a large scale, non-linear problem due to the unknown field map. This can be simplified to a linear problem utilizing $B_0$ maps readily obtained from $^{1}$H data and utilized to calculate $^{13}$C fields, $\psi = \gamma(^{13}C)B_0$.

Thus, at process block 204c, a field map may, optionally, be acquired and used to simplify the reconstruction at process block 204b. While an estimate of field inhomogeneity could be obtained from hyperpolarized $^{13}$C data, $^{1}$H data provides a high resolution dataset that can be averaged to improve estimates of field heterogeneity in regions of low signal. However, motion between the field map acquisition and the HP $^{13}$C experiment may lead to mis-registration or alter the $B_0$ field, hindering spectral separation. This can be mitigated with simultaneous imaging of $^{1}$H and $^{13}$C with k-t spiral to potentially provide single-shot $^{13}$C metabolite maps along with a real-time, inherently registered field map and FOV support from the $^{1}$H spiral data.

With a known field map, equation 7 can be posed as a linear problem in matrix notation:

$$S = E\rho + \epsilon \quad (8);$$

where S is the signal matrix, E is the encoding matrix which is a function of the field map, position in k-space and time (k-t space), $\rho$ is the signal distribution for each metabolite, and $\epsilon$ is the noise error. Given sufficient sampling in the k-t domain, the encoding matrix will be well conditioned and signal distributions will be accurately determined using least square minimization of the $L_2$-norm of the differences:

$$\rho = \arg\min \|E\rho - S\|_2^2 \quad (9).$$

Therefore, using the above-described reconstruction, both spectral and spatial reconstructions can be performed jointly via least squares optimization, for example, using matrix inversion to, at process block 204d, jointly generate spectral and spatial images. Additionally, unlike previous methods which either neglect field inhomogeneity or demodulate the field map in image space, phase accrual during acquisition is corrected at each k-space point, greatly reducing off-resonance blurring artifacts.

This joint k-t reconstruction when used with data acquired using the above-described modified spirals reduces the number of spectral interleaves required, resulting in images that can be acquired with fewer RF excitations. The remaining signal and imaging time can be utilized to enable imaging at a higher temporal resolution, improved spatial resolution or coverage, and/or with magnetization preparation to improve quantification. In the case of HP [1-$^{13}$C]pyruvate, single-shot k-t spiral offers opportunity for fourfold faster imaging. This is without the considerable SNR penalty incurred when utilizing short readout multi-shot approaches that do not efficiently utilize the long $T_2^*$ of $^{13}$C. This allows the extension of the above-described techniques from 2D to 3D, where modeling is more accurate but scan times and RF requirements are greater. The shorter scan time provided by the present techniques allow for the incorporation of physiological gating for cardiac applications and magnetization preparation for improved quantification.

Jointly solving for both spatial and spectral encoding with a least-squares based optimization and reconstruction technique enables single-shot 2D spatial/1D spectral imaging of hyperpolarized $^{13}$C metabolites. By reducing the RF requirements, kt-spiral improves flexibility in sampling strategies and reduces acquisition time, enabling higher temporal resolution. Field inhomogeneity and off-resonance effects are corrected during reconstruction, making k-t spiral robust even in regions of poor field homogeneity.

Multi-Shot $\Delta$TE Analysis

In some situations, single shot k-t sampling will be impractical and multiple spectral interleaves will be required to sufficiently sample k-t space. When using IDEAL-based reconstruction approaches, the optimal inter-spiral echo-spacing $\Delta$TE may be chosen by maximizing the number of signal averages (NSA) for each chemical species. For joint k-t reconstruction, direct NSA calculations are computationally impractical due to the large size of the encoding matrix described in equation 8. In order to determine the optimal $\Delta$TE for multiple spectral interleaves, digital simulations were performed with inter-spiral $\Delta$TEs ranging from 0.1 ms to 3.0 ms in 0.1 ms increments using 2-5 echo times and FOV factors ($\eta$) of 1, 4, and 7. These FOV factors were chosen to correspond to conventional IDEAL, gradient limited, and high performance gradient cases respectively. Root mean square error (RMSE) was calculated by comparing the signal in each metabolite region of interest (ROI) with the ground truth (digital phantom). The optimal $\Delta$TE was chosen as the smallest $\Delta$TE which minimized RMSE for all metabolites.

Figure 5:
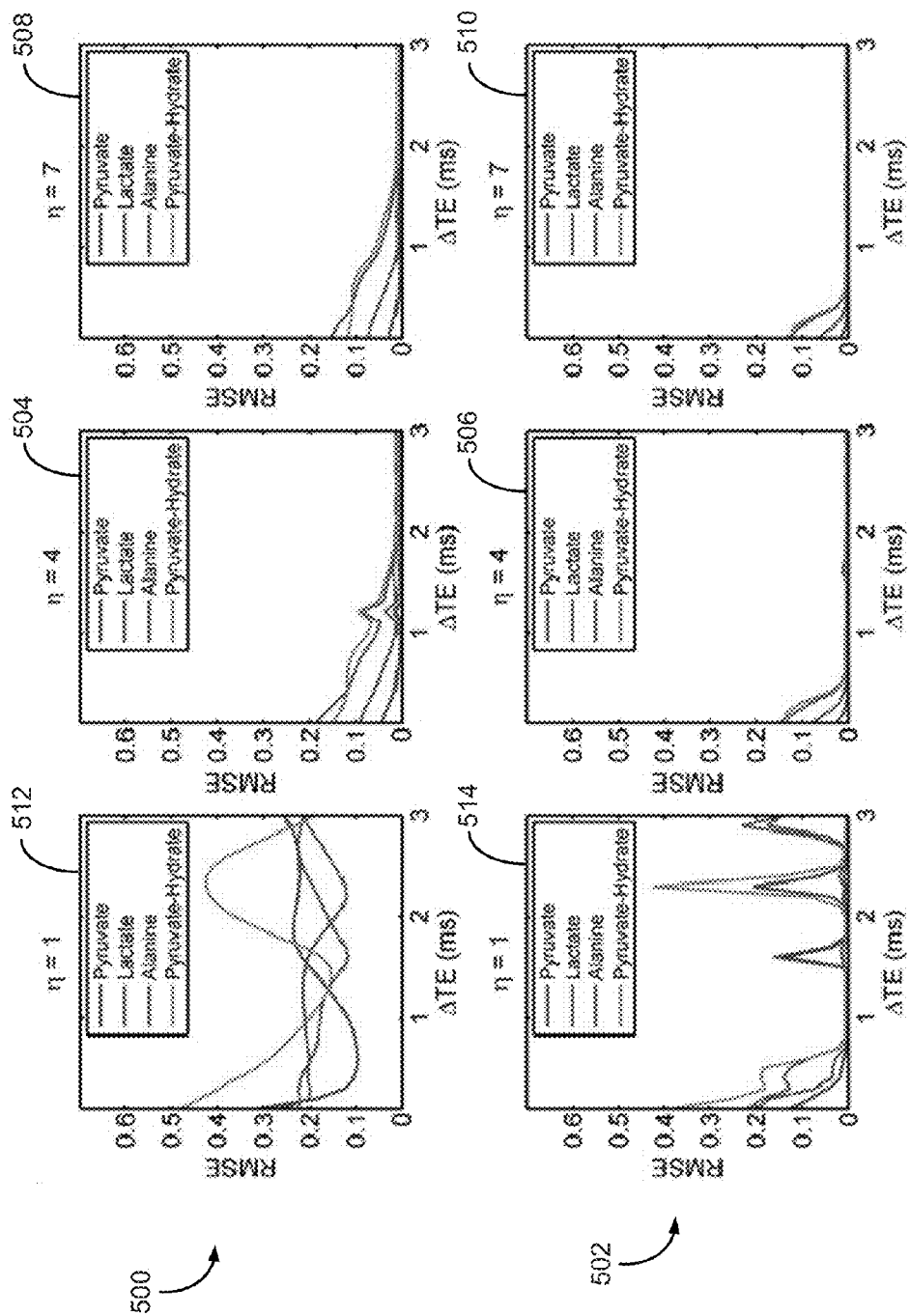
FIG. 5 is a series of graphs illustrating relative root mean square error (RMSE) as a function of spectral interleaf $\Delta TE$ for various echo numbers.

RMSE plots for pyruvate, lactate, alanine, and pyruvate-hydrate at 4.7 T as a function of $\Delta$TE can be seen in FIG. 5. Specifically, relative RMSE as a function of spectral interleaf $\Delta$TE for two echoes 500 and five echoes 502 for three FOV factors, corresponding to conventional IDEAL, gradient limited, and high performance gradients are illustrated. Poor noise performance is indicated by high RMSE and occurs when in-phase images are acquired. For $\eta$=4 (504/506) or 7 (508/510), RMSE is less than 5% for $\Delta$TE$\geq$1.4 ms using two echo times or $\Delta$TE>1.1 ms using all five echo times. This broad RMSE minimum indicates that the choice of $\Delta$TE is not critical to obtain optimal noise performance, so long as a sufficiently large echo-spacing is prescribed to allow sufficient phase accrual between spectral interleaves. For $\eta$=1 (512/514), which corresponds to conventional spiral IDEAL CSI, using only two echo-times results in an underdetermined system, as indicated by the large RMSE for all $\Delta$TE values. Using all five echo times results in regions of local minima with low RMSE. Local maxima for $\eta$=1 correspond to in-phase images, resulting in poor noise performance at these $\Delta$TE times. As aforementioned, a $\Delta$TE=2 ms was chosen for all simulations and in-vivo experiments.

Digital Simulations

Spiral $^{13}$C acquisitions were simulated in Matlab (R2009b, The MathWorks, Natick, Mass.) for [1-$^{13}$C]pyruvate and downstream metabolites at 4.7 T. Simulations utilized a high resolution digital phantom comprised of four distinct circles with smooth edges, representing pyruvate, lactate ($\Delta$f=614 Hz), alanine ($\Delta$f=272 Hz) and pyruvate-hydrate ($\Delta$f=433 Hz). From the phantom, k-space data was simulated by direct evaluation of equation 8 under idealized and realistic conditions. In idealized conditions, noise, field map heterogeneity, and $T_2^*$ were not considered. Under realistic conditions, independently realized complex noise was added to simulated k-space data to mimic the SNR obtained in-vivo. Realistic conditions also considered a Gaussian field map with off-resonance range of ±25 Hz and a global $T_2^*$ of 15 ms, corresponding to a linewidth of 21 Hz.

Constant density spirals were designed with time-optimal gradients for $\eta$ factors ranging from 1 to 9, corresponding to designed FOVs ranging from 32×32 mm$^2$ to 288×288 mm$^2$. In-plane resolution was 2×2 mm$^2$ for all simulations, while the slew-rate was reduced for lower $\eta$ in order to keep the acquisition time of 30 ms constant. A five echo acquisition was simulated, with TR/TE=50 ms/0.6 ms. An echo spacing of 2.0 ms was chosen in order to provide good noise performance across all echo combinations. Data were reconstructed using 1-5 echoes in order to determine the minimum number of echoes required for accurate reconstruction. Ten independent noise realizations were performed. Reconstruction fidelity was assessed by measuring RMSE of each metabolite, and metabolite signal ratios.

Representative metabolite images for an idealized case were created. For $\eta$=1 (spiral designed for 32 mm FOV), metabolite maps reconstructed using fewer than 4 echoes are contaminated by spectral cross-talk. When 4 or more echoes are used, the system is fully determined and spectral contamination is minimal. In this case, the joint k-t reconstruction technique directly accounts for field-map variations, unlike traditional spiral CSI. When larger FOV factors are used, joint reconstruction reduces the number of echo images that are desired, reducing both scan time and RF excitations. In simulations with $\eta=7$, spectral cross-talk is reduced using a single echo and completely mitigated for two or more echoes. This was confirmed by relative RMSE measurements, which was less than 25% using a single echo for $\eta \geq 7$ and less than 10% using two echoes for $\eta \geq 3$.

Figure 6:
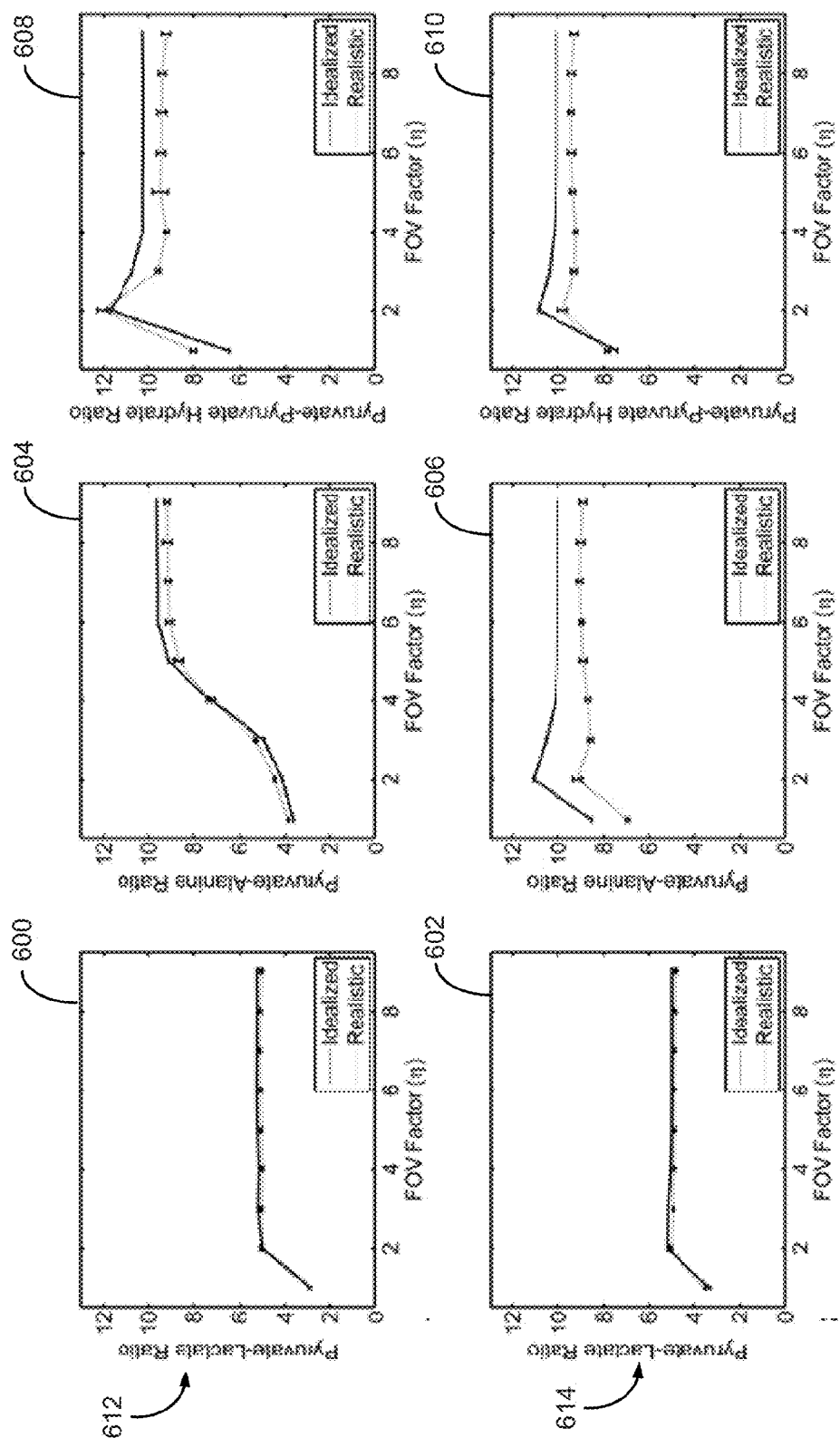
FIG. 6 is a series of graphs illustrating signal ratios as a function of field of view (FOV) factor ($\eta$) for various simulations.

Referring to FIG. 6, this point can be observed in the measured signal ratios between metabolites across a range of FOV factors. Specifically, in FIG. 6, signal ratios for a series of metabolites, including pyruvate-lactate 600/602, pyruvate-alanine 604/606, and pyruvate-pyruvate hydrate 608/610, as a function of FOV factor ($\eta$) for simulations using one 612 or two 614 spectral interleaves are illustrated. The idealized case was simulated in the absence of noise, $T_2^*$ or field inhomogeneities. The realistic case was simulated with 5% noise, a 15 ms $T_2^*$ and $\Delta B0=\pm 25$ Hz. Under realistic conditions, signal ratios are within 9% for $\eta \geq 6$ for all metabolites using only one echo and are within 13% for $\eta \geq 4$ for all metabolites using two echoes.

In the idealized case, which ignores field inhomogeneities, $T_2^*$ decay and system noise, signal ratios using two echoes were within 2% for $\eta \geq 4$. For only a single echo, all metabolite signal ratios were less than 5% for $\eta \geq 6$. Even in the realistic case with field inhomogeneities and a short $T_2^*$, the k-t spiral reconstruction accurately measures metabolite ratios. Simulations incorporating realistic noise levels (5% independently realized complex noise in k-space) with field inhomogeneity ($\pm 25$ Hz) and $T_2^*$ (15 ms) resulted in metabolites signal ratios that were within 13% for all metabolites using two echo times for $\eta \geq 4$. For a single-shot, all metabolite signal ratios were less than 9% for $\eta \geq 6$, indicating that high fidelity single-shot imaging is attainable with a large FOV factor.

For $\eta=1$ (spiral designed for 32 mm FOV), metabolite maps reconstructed using fewer than 4 echoes are contaminated by spectral cross-talk. When 4 or more echoes are used, the system is fully determined and spectral contamination is minimal. In this case, the joint k-t reconstruction technique is similar to spiral IDEAL CSI but directly accounts for field-map variations. When larger FOV factors are used, joint reconstruction reduces the number of echo images required, reducing both scan time and RF excitations. In simulations with $\eta=7$, spectral cross-talk is reduced using a single echo and completely mitigated for two or more echoes. This is confirmed by relative RMSE measurements, which are less than 25% using a single echo for $\eta \geq 7$ and less than 10% using two echoes for $\eta \geq 3$.

This can be observed in the measured signal ratios between metabolites across a range of FOV factors. In the idealized case, which ignores field inhomogeneities, $T_2^*$ decay and system noise, signal ratios using two echoes were within 2% for $\eta \geq 4$. For only a single echo, all metabolite signal ratios were less than 5% for $\eta \geq 6$. Even in the realistic case with field inhomogeneities and a short $T_2^*$, the k-t spiral reconstruction accurately measures metabolite ratios. Simulations incorporating realistic noise levels (5% independently realized complex noise in k-space) with field inhomogeneity ($\pm 25$ Hz) and $T_2^*$ (15 ms) resulted in metabolites signal ratios that were within 13% for all metabolites using two echo times for $\eta \geq 4$. For a single-shot, all metabolite signal ratios were less than 9% for $\eta \geq 6$, indicating that high fidelity single-shot imaging is attainable with a large FOV factor.

Phantom Validation

A thermally polarized multi-spectral phantom comprised of $^{13}$C urea ($\Delta f=-488$ Hz), [1-$^{13}$C]glycine ($\Delta f=0$ Hz) and [1,4-$^{13}$C$_2$]succinate ($\Delta f=493$ Hz) was imaged to experimentally validate the reconstruction technique. Each compound was placed in a separate 1 mL syringe and doped with 4 mM Multihance (Bracco, Princeton, N.J., USA) to shorten $T_1$. The three syringes were placed in a triangular configuration and inserted into a 50 mL vial filled with water. Spiral data were initially obtained with a FOV of $32 \times 32$ mm$^2$ and a $24 \times 24$ matrix resulting in an in-plane resolution of $1.33 \times 1.33$ mm$^2$. Five echoes were obtained per dataset, with a 20° flip-angle and TR/TE=45 ms/0.6 ms. A $\Delta$TE of 0.68 ms was utilized based on NSA performance analysis for the three chemical species. A 10 mm thick slice and 768 averages were acquired to increase SNR, for a total scan time of 173 s. Three subsequent experiments were performed, with the FOV and matrix size concomitantly increased by a factor of 2-4. The readout time of 30.7 ms was held constant by derating the gradients in order to provide equal noise levels in raw data across all experiments. To correct the $^{13}$C data for phase errors arising from field inhomogeneity, a field map was obtained on the $^1$H channel with a multi-echo gradient echo sequence. A spectral-spatial excitation was used to minimize contamination from off-resonance $^1$H chemical species. Reconstructions were performed using 1-5 echoes. Reconstruction accuracy was measured by calculating the RMSE of each chemical species with respect to the fully sampled, 5 echo acquisition.

Reconstruction with only one echo at a prescribed FOV of $32 \times 32$ mm$^2$ ($\eta=1$) resulted in images that are contaminated from spectral cross-talk. This was expected, as the system was underdetermined. As the FOV factor increased, adjacent spiral rotations were modeled as intra-spiral echoes, enabling reconstruction from data acquired with only a single echo and resulting in images that were free of spectral contamination.

Figure 7:
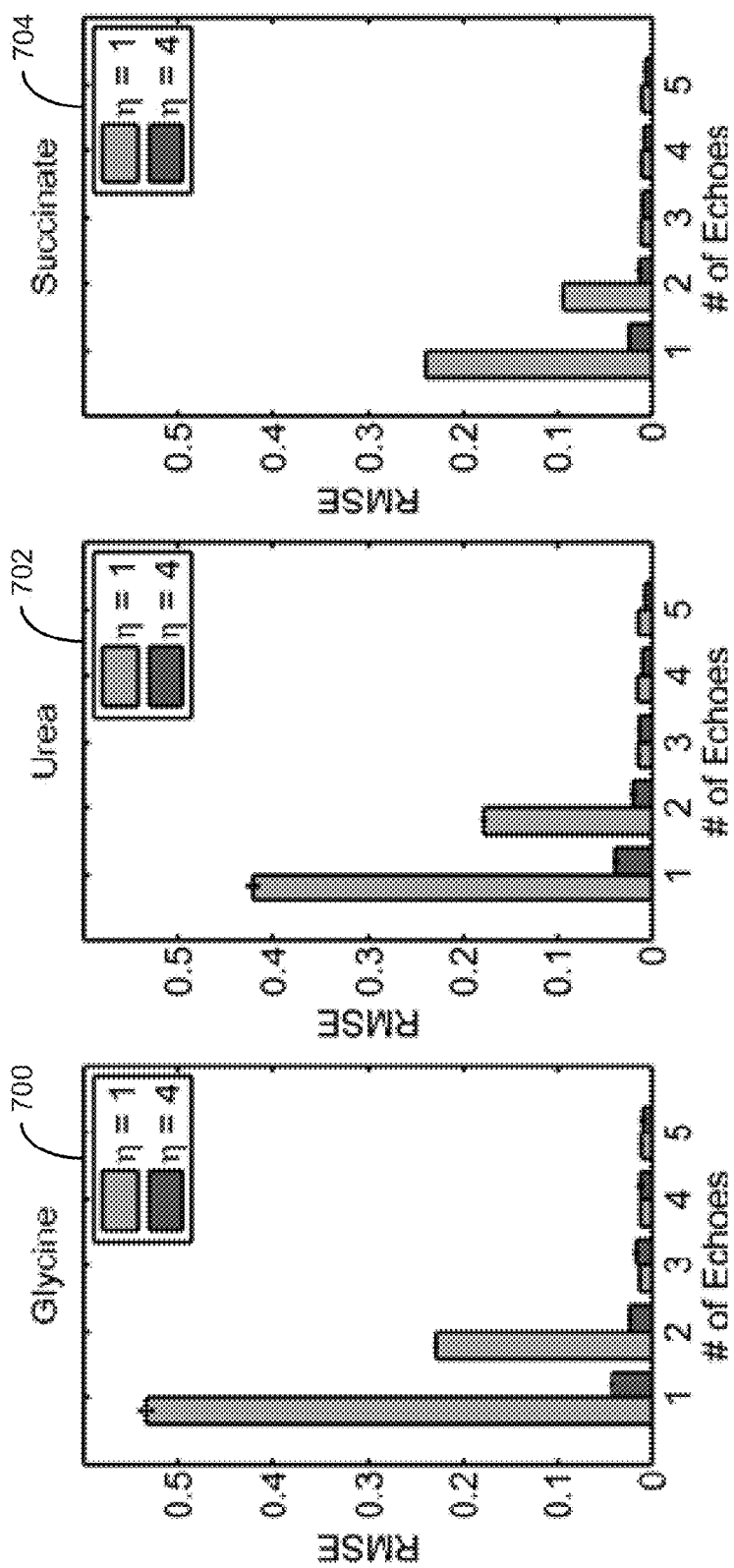
FIG. 7 is a series of graphs illustrating relative RMSE as a function of number of reconstructed echoes.

Referring to FIG. 7, this was qualitatively measured by calculating RMSE with respect to a 5-echo acquisition. Specifically, FIG. 7 illustrates relative RMSE as a function of number of reconstructed echoes for $\eta=1$ and 4 for glycine 700, urea 702, and succinate 704. For $\eta=1$, three or more echoes were used to reduce the RMSE to less than 20 percent for all three species. Conversely, increasing $\eta$ to 4 reduced the RMSE to less than 5 percent, even with only a single RF excitation.

In-Vivo Experiments

Hyperpolarized experiments were performed in a healthy female ICR mouse (43 g; 1 year of age) to assess the efficacy of the above-described kt-spiral imaging technique in dynamic hyperpolarized experiments. 30 µL samples of [1-$^{13}$C]pyruvic acid (Sigma-Aldrich, St. Louis, Mo., USA) and 15 mM trityl radical (OX63; GE Healthcare) were inserted into a Hypersense polarizer (Tubney Woods, Abingdon, Oxfordshire, UK), cooled to 1.4K and irradiated with 94.1 GHz microwaves for one hour. Samples were subsequently dissoluted with 4 mL 100 mM NaOH/Tris buffer and 100 mg/L EDTA, resulting in a solution of 100 mM pyruvate at physiologic temperature and pH. Pyruvate was rapidly injected via a tail-vein catheter at a dose of 9 µL/g into the mouse. The mouse was fasted for 4.5 hours prior to imaging in order to achieve a reproducible metabolic state. Animal respiration was monitored and temperature was maintained at $36.5 \pm 0.5°$ C. with a hot-air blower. All experiments were performed under protocols approved by our Institutional Animal Care and Use Committee.

Two sets of HP $^{13}$C imaging experiments were performed. In the first, data were acquired with an FOV of 224×224 mm$^2$ and a 112×112 matrix, corresponding to $\eta$=7 and resulting in an in-plane resolution of 2×2 mm$^2$. Five echoes were acquired, with a 30.24 ms readout duration and TR/TE/$\Delta$TE=50/0.6/2.0 ms. A 10 degree, 300 μs sin c excitation was used to excite a 10 mm thick slice while minimizing chemical shift artifacts in the slice-select direction. Prior to spiral imaging, a slice-selective spectrum with a 5 kHz spectral bandwidth was acquired to determine the metabolite frequencies relative to the center frequency for use in the reconstruction. A 5 second delay was inserted between imaging frames to allow time for metabolism. In a second experiment, data were acquired with a reduced FOV factor of $\eta$=4 to measure performance in situations where larger FOV factors are impractical due to gradient hardware limitations. All other scan parameters were identical. Data were corrected for RF decay and separately reconstructed using 1-5 echoes. $^{13}$C bicarbonate was excluded from reconstruction because of very low signal levels in renal imaging. Whole kidney ROIs were drawn based on an anatomical $^1$H image in order to calculate the average metabolite signal at each time frame. Fidelity was assessed by comparing metabolite dynamics for each reconstruction to the fully sampled five-echo reconstruction by calculating RMSE and intraclass correlation coefficients (ICC) for pyruvate and lactate.

For all hyperpolarized experiments, an estimate of the field inhomogeneity was obtained prior to $^{13}$C imaging with a $^1$H multi-echo gradient echo sequence. Optimal echo-times determined from fat-water NSA analysis and the field map was calculated using image-space IDEAL. Following $^{13}$C experiments, the spiral trajectory was measured on the $^1$H channel using a thin-slice excitation technique.

In-vivo results from renal imaging using HP [1-$^{13}$C]pyruvate provided pyruvate and lactate images that were in good agreement with underlying anatomy, with pyruvate images dominated by the vasculature and lactate predominantly confined to the kidneys and liver. Metabolite dynamics from a whole kidney ROI reconstructed using all five echoes was considered as an internal reference. RMSE and ICC were calculated by comparing the metabolite time course for each reconstruction to the reconstruction using a fully sampled five echo dataset. The RMSE and ICC indicate strong signal fidelity for the single-shot acquisition, as indicated in the following table:

|  | $\eta$ = 7 | | $\eta$ = 4 | |
| --- | --- | --- | --- | --- |
|  | RMSE | ICC | RMSE | ICC |
| Pyruvate, single echo | 0.022 | 0.986 | 0.128 | 0.96 |
| Lactate, single echo | 0.036 | 0.912 | 0.11 | 0.84 |
| Pyruvate, two echoes | 0.015 | 0.994 | 0.123 | 0.98 |
| Lactate, two echoes | 0.02 | 0.973 | 0.033 | 0.95 |
| Pyruvate, three echoes | 0.013 | 0.997 | 0.043 | 0.985 |
| Lactate, three echoes | 0.017 | 0.994 | 0.041 | 0.954 |
| Pyruvate, four echoes | 0.006 | 0.998 | 0.009 | 0.993 |
| Lactate, four echoes | 0.009 | 0.999 | 0.040 | 0.968 |

In the above table, the RMSE and ICC between a single echo kt-spiral reconstruction and a five echo reconstruction are illustrated. With a large FOV factor ($\eta$=7), both the RMSE and ICC indicate that a single-shot acquisition has high fidelity. Conversely, data acquired with a single-shot using a smaller FOV factor ($\eta$=4) results in metabolite dynamics that are poorly represented, especially for lactate. Using two echoes reduces this error.

Figure 8:
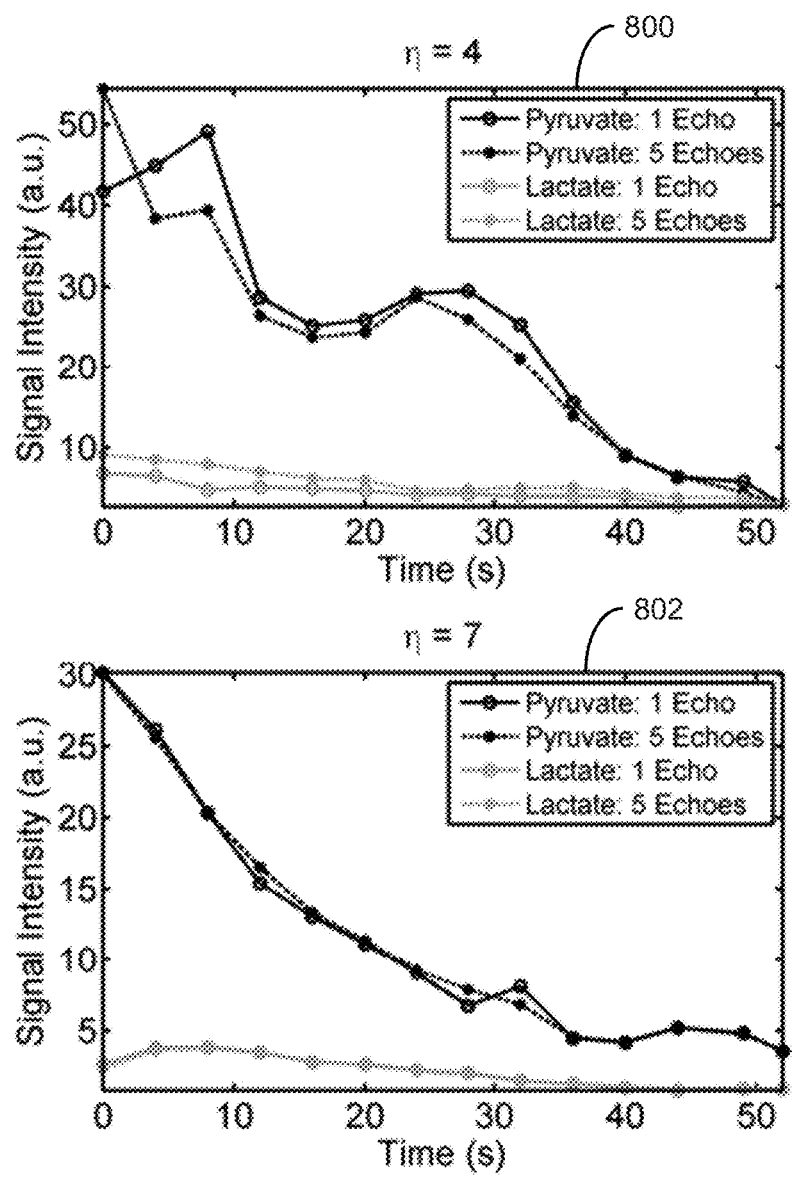
FIG. 8 is a pair of graphs illustrating metabolite time course for pyruvate and lactate for reconstructions using only a single echo or all five echoes.

Thus, data acquired with $\eta$=4 presents a more realistic FOV factor, representing image quality that can be obtained with gradients typical of a clinical system. Metabolite dynamics measured with only a single echo varies considerably compared to the five echo reconstruction. Specifically, referring to FIG. 8, the metabolite time course for pyruvate and lactate for reconstructions using only a single echo or all five echoes is illustrated for both $\eta$=4 800 and $\eta$=7 802. For an FOV factor of 4 800, a single-shot acquisition poorly represents the true dynamics, as compared to the five echo reconstruction. In contrast, acquiring data with a larger $\eta$, such as 7 802, results in strong agreement, indicating that single-shot imaging with large $\eta$ accurately measures metabolism.

Thus, the present disclosure provides a system and method to generate both spectrally and spatially resolved images by jointly reconstructing spectral and spatial domains. This allows flexible design of trajectories in k-t space and reduces sensitivity to $B_0$ heterogeneity. Utilizing this approach, a kt-spiral sampling trajectory was developed to leverage intraspiral rotation time to reduce the number of spectral interleaves.

Digital simulations of [1-$^{13}$C]pyruvate metabolism and spectral $^{13}$C phantom scans were utilized to evaluate this method and demonstrated accurate reconstruction with a single shot spiral acquisition with a large $\eta$. Finally, in-vivo imaging experiments with HP [1-$^{13}$C]pyruvate showed excellent fidelity with the single shot technique when $\eta$ was large. For a modest $\eta$, which represents the FOV factors that can be obtained with a clinical scanner, only as few as two echoes were used to reconstruct data with acceptable RMSE and ICC.

The above examples have been described with respect to utilizing $^{13}$C compounds or other contrast agents with a relatively sparse spectrum. For more complex spectra it is contemplated that multiple shots may be desired. For example, bicarbonate production is routinely observed in hyperpolarized brain and heart studies, and optimal echo spacing and $\eta$ can be determined using processes like those described above.

As described above, the present disclosure recognizes that the quantification of metabolism presents the potential to improve evaluation of cancer. Examples of clinical applications include the imaging, quantification, and tracking of prostate cancer (where lactate can be tracked as an indicator of aggression), breast cancer, brain inflammation and cancer, and the like. These are just a few examples of the broad clinical applicability of the present disclosure to areas of clinical medicine that can benefit from molecular information. For example, the present disclosure may also be used as a means to evaluate the effectiveness of metabolic therapies. The efficiency of the present techniques also permits the targeting of other markers, such as the Kreb cycle, which has a very-short window. Notably, with one carbon labeled in pyrvate, a single spectra is targeted for resolution. When investigating the Kreb cycle, 2 or 3 carbons may be labeled, which results in a more complex spectra. In this regard, the efficiency of the present disclosure is particularly advantageous.

The present techniques can also be combined with proton imaging, either in an interleaved or simultaneous fashion, to provide, for example, fat and water separation. Also, depending upon clinical need or application, the present disclosure may be combined with motion correction techniques, for example, using navigators, to correct for motion occurring during data acquisition. Motion compensation, for example, using navigators, may be performed by interleaving navigator acquisitions with the above-described acquisitions. In this regard, the navigators or other acquisitions may follow a different trajectory. Further still, the present disclosure may be advantageously utilized with PET imaging data to supplement the PET data. In this regard, the present disclosure may be advantageously performed using a combined PET/MR imaging system.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for simultaneously generating spectral images and spatial images of a subject using a magnetic resonance imaging (MRI) system, the steps of the method comprising:
arranging a subject having received a dose of a hyperpolarized molecular imaging agent within a magnetic resonance imaging (MRI) system;
acquiring MR image data from the subject according to a k-space sampling trajectory that spatially oversamples k-space to acquire oversampled points and to encode both spatial frequency information and spectral frequency information in the oversampled points; and
reconstructing the MR image data into spatial and spectral images using a priori knowledge of an expected chemical species associated with the molecular imaging agent and a model-based reconstruction technique.

2. The method of claim 1 wherein the model-based reconstruction technique includes at least one of a least square estimation technique and a compressed sensing technique.

3. The method of claim 1 wherein the k-space sampling trajectory is acquired using a single-shot spiral sampling trajectory.

4. The method of claim 1 wherein the sampling trajectory is performed as part of at least one of a two-dimensional and a three-dimensional acquisition.

5. The method of claim 1 wherein the k-space sampling trajectory that spatially oversamples is acquired using a single radio frequency (RF) excitation.

6. The method of claim 1 wherein the hyperpolarized molecular imaging agent includes $^{13}C$.

7. The method of claim 1 wherein the hyperpolarized molecular imaging agent includes at least one of hyperpolarized [1-$^{13}C$]pyruvate and $^{129}Xe$.

8. The method of claim 1 wherein the k-space sampling trajectory forms an Archimedean spiral trajectory.

9. The method of claim 1 further comprising acquiring a magnetic field map and utilizing the magnetic field map during reconstruction of the MR image data.

10. A magnetic resonance imaging (MRI) system comprising:
a magnet system configured to generate a magnetic field about at least a region of interest (ROI) in a subject arranged in the MRI system;
a plurality of gradient coils configured to apply a gradient field with respect to the magnetic field;
a radio frequency (RF) system configured to apply an excitation field to the subject and acquire MR image data from a ROI;
a computer system programmed to:
control the plurality of gradient coils and the RF system to acquire MR image data according to a k-space sampling trajectory designed to spatially oversample k-space to acquire oversampled points and to elicit phase differences between the oversampled points; and
jointly reconstruct the MR image data into spatial and spectral images by resolving spatial information from spatial encoding associated with each of the oversampled points and resolving spectral information from the phase differences between the oversampled points.

11. The MRI system of claim 10 wherein the computer system is further programmed to use a priori knowledge of an expected chemical species and a model-based reconstruction technique to jointly reconstruct the MR image data into spatial and spectral images.

12. The MRI system of claim 11 wherein the model-based reconstruction technique includes at least one of a least square estimation technique and a compressed sensing technique.

13. The MRI system of claim 11 wherein the computer system is further programmed to receive an indication of a dose of a hyperpolarized molecular imaging agent delivered to the subject and, therefrom, determine the a priori knowledge of the expected chemical species.

14. The MRI system of claim 10 wherein the computer system is further programmed to control the plurality of gradient coils and the RF system to perform the k-space sampling trajectory as a single-shot spiral sampling trajectory.

15. The MRI system of claim 10 wherein the computer system is further programmed to design the sampling trajectory as part of at least one of a two-dimensional and a three-dimensional acquisition.

16. The MRI system of claim 10 wherein the computer system is further programmed to control the plurality of gradient coils and the RF system to perform the k-space sampling trajectory as an Archimedean spiral trajectory.

17. The MRI system of claim 10 wherein the computer system is further programmed to acquire a magnetic field map and utilize the magnetic field map during joint reconstruction of the MR image data.

18. A method for generating spectral images and spatial images of a subject using a magnetic resonance imaging (MRI) system, the steps of the method comprising:
arranging a subject having received a dose of a hyperpolarized molecular imaging agent within a magnetic resonance imaging (MRI) system;
acquiring MR image data using a k-space sampling trajectory designed to spatially oversample k-space to acquire oversampled points and to elicit phase differences between the oversampled points; and
jointly reconstructing the MR image data into spatial and spectral images by resolving spatial information from spatial encoding associated with each of the oversampled points and resolving spectral information from the phase differences between the oversampled points.

19. The method of claim 18 wherein the step of jointly reconstructing includes using a priori knowledge of an expected chemical species associated with the molecular imaging agent and a model-based reconstruction technique to jointly reconstruct the MR image data into spatial and spectral images.

20. The method of claim 18 further comprising acquiring a magnetic field map and utilizing the magnetic field map to jointly reconstruct the MR image data.

21. The method of claim 20 wherein the molecular imaging agent includes $^{13}C$ and wherein the step of acquiring MR image data includes acquiring $^{13}C$ data and $^1H$ data.

22. The method of claim 21 further comprising averaging the $^{13}C$ data and $^1H$ data to improve estimates of field heterogeneity in regions of low signal indicated in the magnetic field map.

23. The method of claim 18 further comprising using multiple RF receiver coils to spatially oversample.

* * * * *

UNITED STATES PATENT AND TRADEMARK OFFICE
CERTIFICATE OF CORRECTION

| | |
|---|---|
| PATENT NO. | : 9,008,399 B2 |
| APPLICATION NO. | : 13/751683 |
| DATED | : April 14, 2015 |
| INVENTOR(S) | : Sean B. Fain, Kevin M. Johnson and Jeremy W. Gordon |

It is certified that error appears in the above-identified patent and that said Letters Patent is hereby corrected as shown below:

In the Specification,

Column 1, line 27 - "process" should be --precess--

Column 15, line 6 - "sin c" should be --sinc--

Signed and Sealed this
Eleventh Day of August, 2015

Michelle K. Lee
*Director of the United States Patent and Trademark Office*